United States Patent
Ghannam

(10) Patent No.: US 10,438,923 B2
(45) Date of Patent: Oct. 8, 2019

(54) METHOD FOR INTEGRATING AT LEAST ONE 3D INTERCONNECTION FOR THE MANUFACTURE OF AN INTEGRATED CIRCUIT

(71) Applicant: 3DIS Technologies, Labege (FR)

(72) Inventor: Ayad Ghannam, Toulouse (FR)

(73) Assignee: 3DIS Technologies, Labege (FR)

( * ) Notice: Subject to any disclaimer, the term of this patent is extended or adjusted under 35 U.S.C. 154(b) by 0 days.

(21) Appl. No.: 15/759,735

(22) PCT Filed: Sep. 14, 2016

(86) PCT No.: PCT/EP2016/071674
§ 371 (c)(1),
(2) Date: Mar. 13, 2018

(87) PCT Pub. No.: WO2017/046153
PCT Pub. Date: Mar. 23, 2017

(65) Prior Publication Data
US 2018/0254258 A1    Sep. 6, 2018

(30) Foreign Application Priority Data
Sep. 14, 2015  (FR) .................................. 15 58544

(51) Int. Cl.
*H01L 21/00*    (2006.01)
*H01L 21/44*    (2006.01)
(Continued)

(52) U.S. Cl.
CPC .......... *H01L 24/82* (2013.01); *H01L 21/4857* (2013.01); *H01L 23/49822* (2013.01);
(Continued)

(58) Field of Classification Search
CPC ......... H01L 33/02; H01L 33/10; H01L 33/12; H01L 33/22; H01L 51/56; H01L 51/5284;
(Continued)

(56) References Cited

U.S. PATENT DOCUMENTS 6,969,916 B2 * 11/2005 Shizuno .............. H01L 23/5389
257/784
8,735,205 B2 * 5/2014 Haba .................... H01L 23/3128
257/E21.567
(Continued)

FOREIGN PATENT DOCUMENTS

WO    WO 99/14404 A1    3/1999

OTHER PUBLICATIONS

Search Report from French Intellectual Property Office on corresponding FR application (FR1558544) dated Jun. 6, 2016.
(Continued)

*Primary Examiner* — Alonzo Chambliss
(74) *Attorney, Agent, or Firm* — Klein, O'Neill & Singh, LLP

(57) ABSTRACT

The invention relates to a method for integrating at least one interconnection for the manufacture of an integrated circuit, including a step of depositing at least one insulating body onto a substrate including a horizontal surface, said insulating body comprising a first wall extending from the horizontal surface of the substrate to a high point of said insulating body and a step of depositing a one-piece electrical structure which is made of an electrically conductive material and extends on the horizontal surface of the substrate and the first wall of the insulating body, the first wall being vertically angled by more than 10 μm and having a rising slope extending from the horizontal surface of the substrate to the high point of said insulating body.

13 Claims, 8 Drawing Sheets

(51) Int. Cl.
*H01L 29/06* (2006.01)
*H01L 23/00* (2006.01)
*H01L 49/02* (2006.01)
*H01L 23/498* (2006.01)
*H01L 21/48* (2006.01)

(52) U.S. Cl.
CPC .............. *H01L 24/24* (2013.01); *H01L 24/32* (2013.01); *H01L 28/10* (2013.01); *H01L 2224/24011* (2013.01); *H01L 2224/24051* (2013.01); *H01L 2224/24105* (2013.01); *H01L 2224/24146* (2013.01); *H01L 2224/24226* (2013.01); *H01L 2224/24265* (2013.01); *H01L 2224/24991* (2013.01); *H01L 2224/24998* (2013.01); *H01L 2224/821* (2013.01); *H01L 2224/82051* (2013.01); *H01L 2224/82101* (2013.01); *H01L 2924/19011* (2013.01); *H01L 2924/19042* (2013.01); *H01L 2924/19104* (2013.01)

(58) Field of Classification Search
CPC . H01L 51/50; H01L 51/5206; H01L 51/5221; H01L 51/5271; H01L 27/322; H01L 27/3211; H01L 24/32; H01L 24/33; H01L 24/82; H01L 24/83; H01L 21/4857; H01L 23/49822
See application file for complete search history.

(56) References Cited

U.S. PATENT DOCUMENTS

| | | |
|---|---|---|
| 2003/0006493 A1 | 1/2003 | Shimoishizaka et al. |
| 2004/0140549 A1 | 7/2004 | Miyagawa |
| 2004/0251525 A1* | 12/2004 | Zilber ................. H01L 23/3114 257/678 |
| 2005/0146005 A1* | 7/2005 | Shimoishizaka ... H01L 29/0657 257/678 |
| 2006/0192299 A1 | 8/2006 | Hashimoto |
| 2008/0046080 A1* | 2/2008 | Vanden Bulcke ... A61N 1/0541 623/10 |
| 2008/0099907 A1* | 5/2008 | Oganesian .......... H01L 23/3114 257/693 |
| 2009/0200686 A1 | 8/2009 | Tsang et al. |
| 2013/0065390 A1* | 3/2013 | Haba ................... H01L 23/3128 438/637 |
| 2016/0013159 A1* | 1/2016 | Kwon .................... H01L 24/05 257/627 |

OTHER PUBLICATIONS

International Search Report and Written Opinion on corresponding PCT application (PCT/EP2016/071674) from International Searching Authority (EPO) dated Feb. 28, 2017.

* cited by examiner

PRIOR ART

METHOD FOR INTEGRATING AT LEAST ONE 3D INTERCONNECTION FOR THE MANUFACTURE OF AN INTEGRATED CIRCUIT

TECHNICAL FIELD

This invention relates to the field of manufacturing an integrated circuit, in particular, 3D interconnection integration for the manufacturing of an integrated circuit comprising a vertical wall greater than 10 µm.

The current requirements in terms of electronic equipment and systems are primarily linked to the miniaturisation, the improvement in performance, the reduction in electrical consumption and the reduction in costs. All branches of electronics are concerned: communications electronics, automobile electronics and more generally on-board electronics, implantable medical electronics, and of course general public electronics products (IT, game consoles, etc.), to mention only a few examples.

Miniaturisation remains however the main constraint as, on the one hand, it often has positive consequences on the other requirements, and on the other hand, as it makes it possible to respond to the need to integrate an ever-increasing quantity of functions into an ever-decreasing volume. Although up until now the efforts have concerned the developments in technologies for the manufacture of chips on semiconductors, this miniaturisation follows Moore's Law established in 1975 and which stipulates that the number of transistors on a chip doubles every two years. On the other hand, the physical limits will soon be reached by these technologies, and it is becoming necessary to develop new channels that make it possible to go beyond Moore's Law and move into the area of "more than Moore".

The heterogeneous integration of electronic systems then appears to be a pertinent response in that it makes it possible to choose, for each function of the system, the semiconductor technology that is best suited, and that it can therefore lead to the integration of a system in a single box of the SiP (System in Package) type that falls in line better with all of the requirements mentioned hereinabove. However, this heterogeneous integration demands the development of new assembly and interconnection technologies suitable for satisfying the needs mentioned hereinabove.

Assembly is a technological method that makes it possible to add and to connect miniature integrated circuits (semiconductor chips) on a host substrate of a system board or of a case. Most solutions for assembling systems are based on the use of micro-soldered wires or on the "flip-chip" technique in order to make the electrical connections between the chips and the substrate. The method of connection via micro-soldered wires is laborious to implement due to the sequential soldering of wires by semi-automated machines. This technique in addition has limits for integration densities linked to the mechanical limits of positioning, as well as for the accessible performances in light of the lengths of the wires processed and the parasites that they introduce. On the other hand, the reliability of the technique of connection via "flip-chip" constitutes a challenge in design and integration due to the defects generated by the thermal stresses.

In addition, producing low-cost and miniaturised radiofrequency (RF) integrated circuits requires the integration of passive elements of high quality, in particular inductive elements such as inductances and transformers. Integrated using conventional technologies, these components are however subjected to stresses that limit their performance. The main limitations come from losses in host substrates (which increase as the resistivity of the substrate decreases, the case in particular with silicon) or in low-thickness metallisations. Likewise, the large surfaces that these integrated components occupy in planar form further increase the losses.

In order to eliminate these disadvantages, it has been proposed to integrate inductive passive elements, such as inductances, above the substrate comprising the active elements of the chip. This technology is known to those skilled in the art under the designation "above-IC". In order to limit the interactions between the substrate and the inductive passive electronic components for which a high level of quality is sought, it is known to carry out a metal screen on said substrate and to form on said screen thick layers of dielectric material whereon these passive components are carried out. In order to connect the components, for example active, optionally integrated on the surface of the substrate, and the inductive passive components formed above this substrate on the thick layer of the dielectric material, it is necessary to carry out the metallised interconnections passing through the thick layer of dielectric material.

In reference to FIGS. 1 to 5, in order to carry out such an interconnection, a method for manufacturing an integrated circuit is known wherein:

- a dielectric layer 2 is partially deposited onto a substrate 1 comprising a horizontal surface 1a, with the dielectric layer 2 comprising a horizontal surface 2c and a vertical flank 2b connecting the horizontal surface 2c of the dielectric layer 2 to the horizontal surface 1a of the substrate 1 (FIG. 1),
- a metallisation coating 3 is deposited onto the horizontal substrate 1 and the dielectric layer 2 in order to cover the horizontal surfaces 1a, 2c and the vertical flank 2b, as such the metallisation coating 3 successively comprises a lower horizontal surface 3a, a vertical surface 3b and an upper horizontal surface 3c (FIG. 2),
- a layer of resin 4 is then partially deposited onto the lower horizontal surface 3a of the metallisation coating 3 (FIG. 3),
- a metal interconnection 5 is then formed by metallisation on the metallisation coating 3 not covered by the layer of resin 4, the metal interconnection 5 comprises a lower horizontal surface 5a, a vertical surface 5b and an upper horizontal surface 5c (FIG. 4), and
- the layer of resin 4 as well as the metallisation coating 3 covered by said layer of resin 4 are then removed in order to expose the horizontal surface 1a of the substrate 1 and as such obtain a passive component, in particular, an inductance (FIG. 5).

Given that the horizontal surfaces and the vertical surface of the metal interconnection are formed simultaneously, 3D interconnection is spoken of in opposition to a 2.5D interconnection for which the various surfaces of the metal interconnection are formed successively.

In a known manner, the metallisation coating 3 is, deposited onto the horizontal substrate 1 and onto the dielectric layer 2 by a physical deposition method. In practice, it is difficult to carry out a deposit on the vertical flank 2b of the dielectric layer 2 given that the metal deposit is applied vertically. To this effect, it is known to apply an initiator, also called a "seed layer enhancement", on the vertical flank 2b in order to deposit a nanometric layer of metal 3b which makes it possible to improve the deposit of the metallisation coating 3. The preparation of the vertical flank 2b is long and expensive due to the application of the initiator. Furthermore, if the initiator is not applied with great care or if the initiator does not evenly adhere to the various materials present on the substrate, the metallisation coating 3 is applied discontinuously which has as a disadvantage of generating open electric circuits preventing the formation of the metal interconnection 5.

In prior art, it is known from patent application WO 99/14404 A1 a method for forming a coating by metal deposit using a moderate heat treatment. This application aims to anneal a metal which has been deposited in order to reorganise its internal structure and limit is mechanical weaknesses. U.S. Patent application 2003/006493 A1 relates to a method for manufacturing an electronic component wherein electronic chips are superimposed vertically as a pyramid. US application 2009/200686 A1 relates to an electrical connection structure which is suitable for covering a block of elastomer. US application 2004/140549 A1 relates to a method for the electrical connection of a component by depositing metal particles, in particular, via an "inkjet" method. US application 2006/192299 A1 relates to a method for manufacturing a piece of electronic equipment comprising a connection extending from a lower plane to a higher plane.

The invention therefore has for purpose to overcome these disadvantages by proposing a method for carrying out a 3D interconnection which is simple to implement, reliable and of which the cost is low in order to allow for the integration, on the one hand, of miniaturised and high-performance electronic systems without using micro-soldered wires or microwelds and, on the other hand, miniature and high-quality inductive passive 3D components.

SUMMARY

To this effect, the invention relates to a method for integrating at least one interconnection for the manufacture of an integrated circuit comprising:
- a step of depositing at least one insulating body onto a substrate comprising a horizontal surface, said vertical surface comprising a first wall extending from the horizontal surface of the substrate to a high point of said body,
- a step of depositing a one-piece electrical structure which is made of an electrically conductive material extending on the horizontal surface of the substrate and the first wall of the body to a high point of said insulating body in such a way as to form an interconnection.

The method is remarkable in that the first wall is vertically angled and has a rising slope from the horizontal surface of the substrate to the high point of said insulating body, with the first wall comprising a horizontal component and a vertical component greater than 10 µm, the ratio of inclination of the horizontal component over the vertical component is between 0.001 and 1.35.

Thanks to such a method, the electrical structure can be applied quickly and practically without the preliminary application of an initiator as in prior art, which procures a savings in time and a reduction in cost. The range of the inclination ratio of the first wall makes it possible, on the one hand, to limit the surface occupied by the interconnection in order to allow for optimum miniaturisation and, on the other hand, to facilitate the electrolytic growth of the electrical structure and/or the depositing of a bond coat on a substantially vertical surface. Thanks to the invention, the structure obtained is one-piece, of quality and fast to form.

Incidentally, it is known from patent application WO2012/045981 a method wherein an electrical structure is formed with a vertical flank, i.e. on a wall not vertically angled, or a flank with undercuts, i.e., of which the slope falls starting from the substrate and which requires the use of seals.

Such an angle of inclination makes it possible to distinguish "natural" slopes from the layers of silicon which are carried out by lithography and wet etching. Such a slope has a high inclination and depends on the crystalline plane of the silicon.

Preferably, the ratio of inclination of the horizontal component over the vertical component is between 0.01 and 1.

Such a first wall makes it possible to facilitate the electrolytic growth of the electrical structure and/or the depositing of a bond coat onto a substantially vertical surface. Thanks to the invention, the structure obtained is one-piece and is quick to form.

Advantageously, the inclination ratio provides a compromise between the surface occupied by the interconnection and the conformity of the latter.

The insulating body can be formed from an insulating material or include a body comprised of conductor and/or semi-conductor and/or magnetic and/or dielectric material which is insulated, i.e., covered with an insulating layer.

According to an aspect, the insulating body is comprised of insulating material.

According to another aspect of the invention, the insulating body comprises a body comprised of conductor and/or semi-conductor and/or magnetic and/or dielectric material, covered by an insulating layer. As such, an insulating body can advantageously be formed by covering a body comprised of a conductor and/or semiconductor and/or magnetic and/or dielectric material by an insulating layer, which makes it possible to electrically insulate the interconnections from said body.

Preferably, said body comprised of a conductor and/or semi-conductor and/or magnetic and/or dielectric material has a first vertical wall or undercuts, with the insulating layer covering the first vertical wall or with undercuts making it possible to obtain the inclination of the first wall of the insulating body.

Advantageously, the insulating layer makes it possible to obtain the inclination ratio sought while the body comprised of a conductor and/or semiconductor and/or magnetic and/or dielectric material comprises a vertical wall or undercuts. In another advantageous manner, the insulating layer makes it possible to provide the physical continuity between the surface of the substrate and said body, which makes it possible to provide the electrical continuity of the bond coat and/or of the electrical structure. The method can as such be applied in many different configurations.

According to another aspect of the invention, said body comprised of conductor and/or semi-conductor and/or magnetic and/or dielectric material has a first wall with undercuts, with the insulating layer covering the first wall with undercuts making it possible to electrically insulate the interconnections from said corps. Advantageously, the insulating layer makes it possible to provide the physical continuity between the surface of the substrate and said body, which makes it possible to provide the electrical continuity of the bond coat and/or of the one-piece electrical structure.

According to a preferred aspect, the first wall of the insulating body is planar which makes it possible to improve the adherence of the conductive layers and to facilitate the method of structuring electrical structures. Preferably, the body has a section in the shape of a trapeze.

According to another aspect, the first wall of the insulating body is curved which makes it possible to improve the electrical and mechanical performance of the electrical structures. Preferably, the insulating body has a section in the shape of a half-ellipse.

According to another aspect, the first wall of the insulating body forms a staircase comprising a plurality of horizontal portions and a plurality of vertical portions.

According to another aspect, the first wall of the insulating body is comprised of a flat portion and of a curved portion which makes it possible to improve the electrical and mechanical performance of the electrical structures. Preferably, the insulating body has a section in the shape of a hysteresis.

Preferably, the first wall is vertically angled and has a rising slope from the horizontal surface of the substrate to the high point of said insulating body, with the first wall comprising a horizontal component and a vertical component greater than 10 µm, the ratio of inclination of the horizontal component over the vertical component is between 0.001 and 1.35, the insulating body comprising a body comprised of conductor and/or semi-conductor and/or magnetic and/or dielectric material, having a vertical wall or with undercuts, which is covered by an insulating layer, the insulating layer covering the vertical wall or with undercuts making it possible to obtain the inclination of the first wall of the insulating body, the method comprises:
 a step of making openings in the insulating layer,
 a step of depositing a one-piece electrical structure which is made of an electrically conductive material extending on the horizontal surface of the substrate and the first wall of the insulating body in such a way as to form an interconnection with the body comprised of conductor and/or semi-conductor and/or magnetic and/or dielectric material via said openings.

As such, the step of applying the insulating layer makes it possible to adjust the inclination of the slope in a practical manner in order to favour the depositing of the electrical structure.

Preferably, as the insulating layer is photosensitive, the method comprises a step of insulating the insulating layer through a mask in such a way as to precisely control the angle of the first wall of the insulating body. As such, even if the step of applying the insulating layer is not precise enough, the step of insulating makes it possible to precisely control the inclination.

Preferably, the mask comprises a zone, configured to insulate the first wall from the insulating body, which comprises a plurality of patterns of variable lengths and widths in such a way as to control the inclination thereof. In other words, thanks to the mask, the insulation is heterogeneous and makes it possible to remove various thicknesses of insulating layer in order as such to control the slope.

More preferably, said zone comprises a plurality of patterns of which the width is decreasing along an axis directed from the top of the first wall of the insulating body downwards. As such, this makes it possible to increase the inclination of the slope formed during the application of the insulating layer.

Preferably, the mask comprises a plurality of different zones in such a way as to individually control the angle of several first walls. It is as such possible to carry out an integrated circuit adapted to the needs.

Preferably, the patterns are positioned parallel to the slope of the first wall of the insulating body in such a way as to create a determined insulation at a predetermined slope height. The insulation is homogenous at a determined height in such a way as to form an even inclination.

According to a preferred aspect, the openings in the insulating layer are carried out during the step of insulating, which accelerates the method of manufacture.

Preferably, the method comprises a step of depositing a layer of resin onto the insulating layer in such a way as to form a mould that limits the extension of the electrically conductive material during the step of depositing the electrical structure. As such, the mould makes it possible to structure the interconnection formed.

Preferably, said mould has a thickness between 10 and 150 µm and has a width/thickness resolution between 1 for 0.5 and 1 for 50, preferably, between 1 for 2 and 1 for 25.

Preferably, the substrate comprising a cavity wherein is positioned the insulating body, said mould extends at least partially into said cavity adjacently to said insulating body. As such, the interconnection fills only a single portion of the cavity, which increases the flexibility.

Preferably, the horizontal component is between 0.1 and 150 µm, preferably, between 1 and 75 µm.

Preferably, the method comprises a step of depositing a bond coat onto said substrate and said vertical surface prior to the step of depositing the electrical structure and/or the layer of resin forming the mould. A bond coat is also used as a base for the electrolytic growth of the electrical structure.

Preferably, the method comprises a step of depositing a plurality of one-piece electrical structures made of an electrically conductive material over a plurality of horizontal surfaces and a plurality of first walls of insulating bodies.

Preferably, the first walls extend in different planes in such a way as to form three-dimensional interconnections.

The invention also relates to an integrated circuit comprising:
 a substrate comprising a horizontal surface,
 at least one insulating body deposited onto said substrate, said body comprising a first wall extending from the horizontal surface of the substrate to a high point of said body,
 a one-piece electrical structure which is made of an electrically conductive material extending over the horizontal surface of the substrate and the first wall of the insulating body.

The circuit is remarkable in that the first wall is vertically angled and has a rising slope from the horizontal surface of the substrate to the high point of said insulating body, with the first wall comprising a horizontal component and a vertical component greater than 10 µm, the ratio of inclination of the horizontal component over the vertical component is between 0.001 and 1.35, preferably, between 0.01 and 1.

Preferably, the integrated circuit comprises a plurality of a one-piece electrical structure.

Preferably, the insulating body comprises a body comprised of conductor and/or semi-conductor and/or magnetic and/or dielectric material covered with an insulating layer, also called a repassivation layer.

BRIEF DESCRIPTION OF THE DRAWINGS

The invention shall be better understood when reading the following description, provided solely by way of example, and in reference to the annexed drawings wherein.

Note that the figures show the invention in a detailed manner in order to implement the invention, said figures able of course to be used to better define the invention where applicable.

DETAILED DESCRIPTION

The method according to the invention allows for the integration of inductive passive 3D components onto a substrate as well as 3D interconnections that connect one or several active or passive components to a substrate.

A method for manufacturing a monolithic integrated circuit according to a first embodiment of the invention shall now be presented in reference to FIGS. 6 to 10 in order to obtain inductive passive electronic components, such as inductances, transformers, couplers, antennas, integrated passive circuits or interconnections.

Such interconnections are configured in particular for establishing electrical connections between different regions of an active or conductive zone of the substrate, between different active or conductive zones of the substrate or between active or conductive zones of several integrated circuits stacked and/or dispersed over the surface of the substrate. They can also form interconnection elements that can allow for the electrical connection of a discrete electronic component, i.e. not integrated into the monolithic circuit.

FIGS. 6 to 16 are presented in an orthogonal system of coordinates X, Y wherein the X axis extends horizontally from left to right while the Y axis extends from the bottom upwards. In the rest of the description, the terms "lower" and "upper" are defined in relation to the vertical axis Y. In what follows, the terms "increasing" and "decreasing" are determined in relation to the vertical axis Y in the system of coordinates X, Y determined hereinabove.

Figure 1:
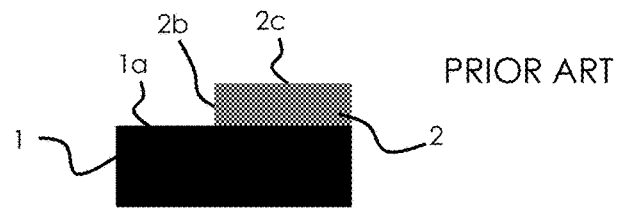
FIGS. 1 to 5 are cross-section diagrammatical views showing the successive steps of a method for manufacturing an integrated circuit according to prior art.
Figure 2A:
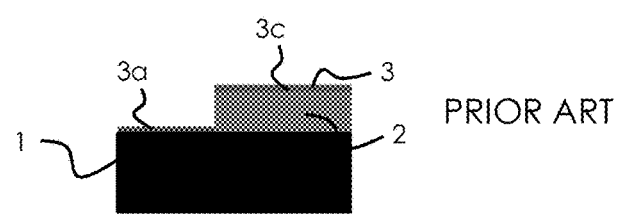
Figure 2B:
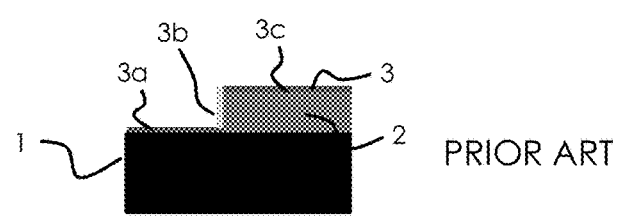
Figure 3:
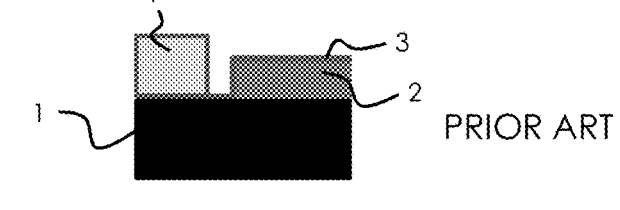
Figure 4:
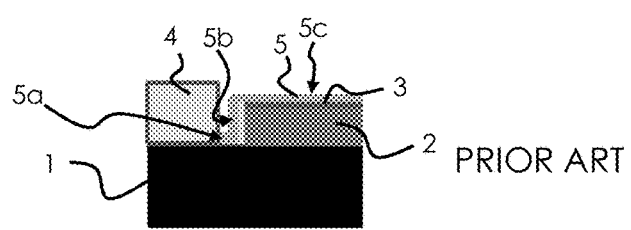
Figure 5:
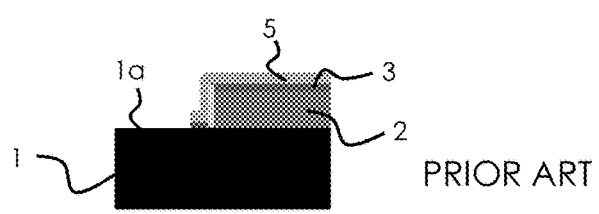
Figure 6:
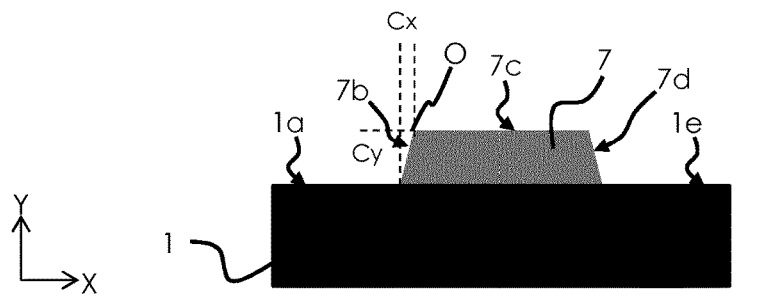
FIGS. 6 to 10 are cross-section diagrammatical views showing the successive steps of a method for manufacturing an integrated circuit according to a first embodiment.

In reference to FIG. 6, substrate 1 is shown having the form of a horizontal layer. The substrate 1 is made from a rigid material, such as silicon, glass, metal, alumina, polymer as well as a combination of different materials or a flexible substrate (made for example from PET, Polymide, etc.). The substrate 1 can be blank or comprise conductive and/or insulating structures. In this example, the substrate 1 has the form of a wafer with a thickness between for example 50 µm and 5 mm. As shown in FIG. 6, the substrate 1 comprises a substantially flat upper surface 1a, said upper surface able to be rough or include reliefs.

In a first step, in reference to FIG. 6, an insulating body 7 is deposited onto the upper surface 1a of the substrate 1. In this example, the insulating body 7 is made of a dielectric material or polymer that will be structured.

In this example, still in reference to FIG. 6, the insulating body 7 comprises a first angled wall rising on the left 7b, an upper horizontal surface 7c forming a high point O of the insulating body 7, a second angled wall decreasing on the right 7d. The angled walls 7b, 7d are angled in relation to the vertical direction Y in such a way as to each comprise a horizontal component Cx and a vertical component Cy. The vertical component Cy is at least 10 µm. The angled walls 7b, 7d each have a rising slope extending from the horizontal surface of the substrate 1 to the high point of said insulating body 7. The body 7 advantageously has a section in the shape of a trapeze of which the wide base rests on the upper surface 1a of the substrate 1.

The second right angled wall 7d is decreasing in the system of coordinates X, Y but it however has a rising slope from the upper surface 1a of the substrate 1 to the upper horizontal surface 7c of the insulating body 7. The slopes are, in this example, symmetrical but it goes without saying that they could be different.

The inclination ratio of the horizontal component Cx over the vertical component Cy is between 0.001 and 1.35, preferably, between 0.01 and 1.

In this embodiment, the angled walls 7b, 7d are flat but it goes without saying that they could be different, in particular, curved as will be presented in what follows.

Figure 7:
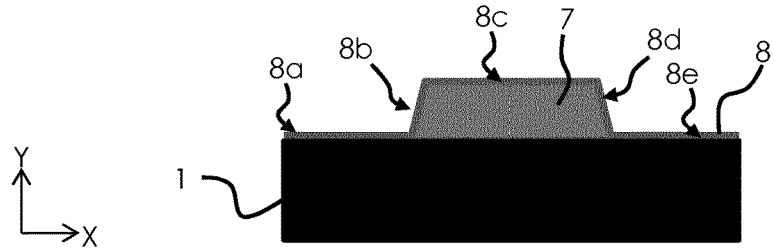

In reference to FIGS. 6 and 7, a bond coat 8 is then directly deposited onto the upper surface of the substrate 1 and of the insulating body 7. In this example, the bond coat 8 successively comprises a left lower horizontal portion 8a, a left angled portion 8b, an upper horizontal portion 8c, a right angled portion 8d, a right lower horizontal portion 8e which respectively cover the left horizontal surface 1a of the substrate 1, the first left increasing angled wall 7b of the insulating body 7, the upper horizontal surface 7c of the insulating body 7, the second angled wall decreasing to the right 7b of the insulating body 7 and the right horizontal surface 1e of the substrate 1.

Advantageously, given that the walls 7b, 7d of the insulating body 7 are angled, the walls 8b, 8d of the bond coat 8 are also angled as shown in FIG. 7.

The bond coat 8, also called electrolytic growth layer, is formed in this example by the depositing of a metal material, in particular of an electrically conductive or semi-conductive material, able to promote the adhesion of the material comprising the electrical structure by electrolytic growth. By way of example, the bond coat 8 is a thin layer, with a thickness between 1 nm and 2 µm made of titanium, chromium, tantalum, tungsten, aluminium, gold, copper, silver, nickel or a metal alloy such as and not limited to titanium/tungsten, nickel/boron or a metal/semi-conductor alloy such as and not limited to aluminium/silicon or other. Advantageously, this layer is carried out as a successive deposit of two or of several layers of metal, such as for example of titanium/copper, titanium/gold, chromium/gold, Titanium/Nickel/gold or other possible configurations.

The bond coat 8 is deposited by a conventional method of "vertical" depositing of a metal material known to those skilled in the art, in particular par cathode pulverisation, by thermal evaporation or by electrografting. During such a depositing, all of the surfaces of the substrate 1 and of the insulating body 7 are cleared and are as such easily reached by the metal material constituting the bond coat 8, and as such these surfaces are covered homogeneously and continuously.

Advantageously, it is not necessary to use an initiator, which reduces the number of technological steps as well as the costs and the time for manufacturing, limits the risk of defects and responds to the various weak points mentioned hereinabove.

Figure 8:
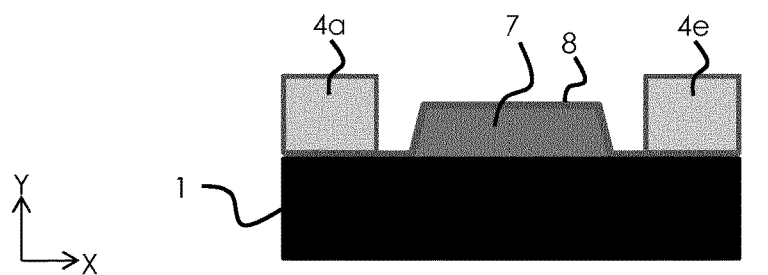

In reference to FIG. 8, layers of resin 4a, 4e are then deposited onto the bond coat 8 so as, on the one hand, to cover the regions that are not configured to be put into contact with the electrical structure and, on the other hand, to leave uncovered the regions of the bond coat 8 configured to be put into contact with the electrical structure. In a manner known to those skilled in the art, the layers of resin 4a, 4e are deposited simultaneously. A mould is as such formed for the depositing of the electrical structure, able to limit the extension of the electrically conductive material during the step of electrolytic depositing, with the electrically conductive material not being able to be deposited on the zones of the bond coat 8 covered by the layers of resin 4a, 4e.

In this example, the layers of resin 4a, 4e are respectively deposited on the left lower horizontal portion 8a and the right lower horizontal portion 8e as shown in FIG. 8.

Each layer of resin 4a, 4e having the structure sought is obtained by any suitable method known to those skilled in the art, in particular by lithography or inkjet printing. In this example, each layer of resin 4a, 4e has a substantial thickness, in particular a thickness between 10 µm and 500 µm. In the example shown, it has a thickness equal to about 150 µm. The resin forming the layer of resin 4a, 4e is in particular a photosensitive resin having a resolution between 1 for 0.5 and 1 for 50, preferably between 1 for 2 and 1 for 25. In the example shown, the resin has a resolution of 1 for 15, i.e. the smallest width of the segments that can be obtained by photolithography is 10 µm thick. It is as such possible to form patterns with a width greater than or equal to 10 µm for a resin thickness of 150 µm.

Advantageously, the mould formed by the layers of resin makes it possible to structure different types of interconnections. So as to allow for the housing of a body 70 (in particular one or several chips) which is thick and which cannot be thinned, it is advantageous to provide a cavity in the substrate for the mounting of said body 70. This makes it possible to limit the overall thickness of the integrated circuit. Thanks to the invention, it is possible to carry out interconnections in the cavity following the mounting of said body 70, in particular, in the adjacent cavities C1, C2 formed between the body 70 and the raised edge of the substrate 70 as shown in FIGS. 30A and 30B.

Figure 30A:
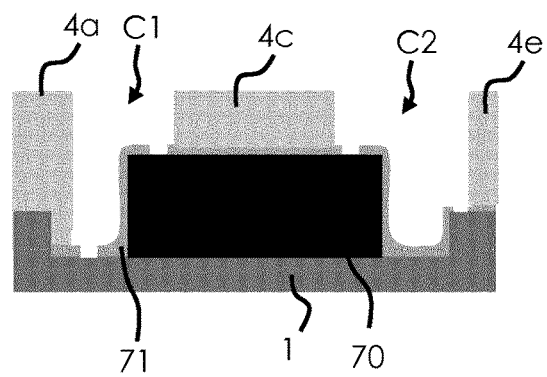
FIGS. 30A and 30B show a step of forming interconnections in a cavity wherein the body is mounted.
Figure 30B:
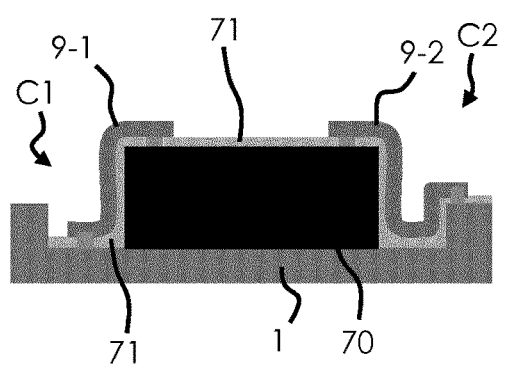

According to a first embodiment, in reference to FIG. 30A a block of resin 4a comprises a portion extending into the first adjacent cavity C1 onto the insulating layer 71 in such a way as to limit the dimensions of the interconnection 9-1 in the first adjacent cavity C1 while still allowing it to extend to the upper wall of the body 70 as shown in FIG. 30B. As such, the interconnection 9-1 has an S-shaped profile.

According to a second embodiment, in reference to FIG. 30A a block of resin 4e is positioned outside of the second adjacent cavity C2 in such a way as to authorise the interconnection 9-2 to extend entirely into the second adjacent cavity C2 while still allowing it to extend to the upper wall of the body 70 as shown in FIG. 30B. As such, the interconnection 9-2 has a U-shaped profile.

Such interconnections 9-1, 9-2 make it possible to stack a substantial number of electronic chips in a cavity of the substrate while still having an integrated circuit of low thickness.

Figure 9:
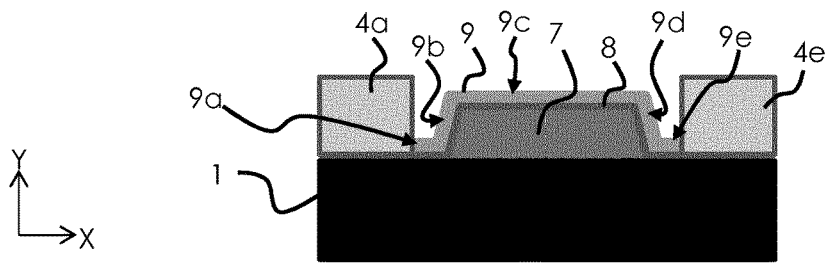

In reference to FIG. 9, the electrical structure 9 is then formed by simultaneously depositing, by a method of electrolytic depositing, the electrically conductive material onto the zones 9a-9e of the continuous bond coat 8 not covered by the layers of resin 4a, 4e. Due to its continuity, the bond coat 8 is able to conduct an electric current over its entire surface, and as such to allow for the formation simultaneously and as a single piece of the electrical structure 9.

Advantageously, given that the walls 8b, 8d of the bond coat 8 are angled, the electrolytic growth is improved, which improves the control of the thicknesses.

The electrical structure 9 is made from an electrically conductive material, and able to be deposited by electrolysis. It is advantageously made of copper. Alternatively, it is made from gold or all other metals that allow for an electrolytic depositing.

The electrical structure 9 forms for example all or a portion of an electronic component, in particular of a passive electronic component such as an inductance, a transformer, an antenna, etc. It can also form an interconnection line, configured to connect together different regions of the substrate 1 and/or different regions of the substrate 1 and of the insulating body and/or different regions of the insulating body. The thickness of the electrical structure 9 depends on its electronic function. It also depends on the application of the circuit. By way of example, electrical structures 9 will be provided with higher thicknesses in a power amplifier circuit than in a digital circuit. For the purposes of information, the thickness of an electrical structure 9 is for example between 1 µm and 150 µm. After having formed the electrical structure 9, (FIG. 10) the layers of resin 4a, 4e are dissolved, for example by immersing the unit shown in FIG. 9 in a bath able to selectively dissolve the layers of resin 4a, 4e or by other techniques known to those skilled in the art or supplied by the manufacturer of the material.

Figure 10:
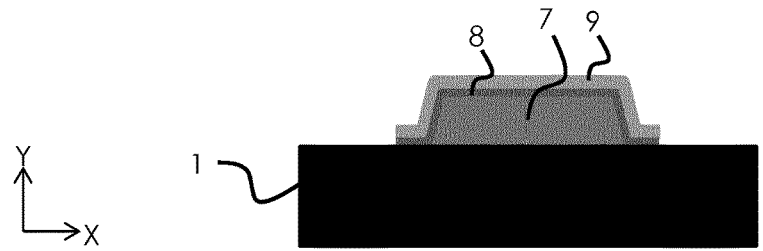
Figure 11:
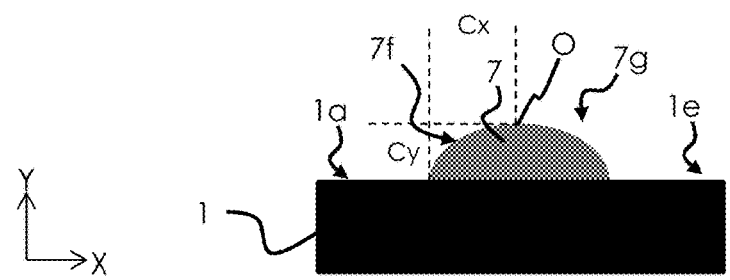
FIGS. 11 to 16 are cross-section diagrammatical views showing the successive steps of a method for manufacturing an integrated circuit according to a second embodiment.
Figure 12:
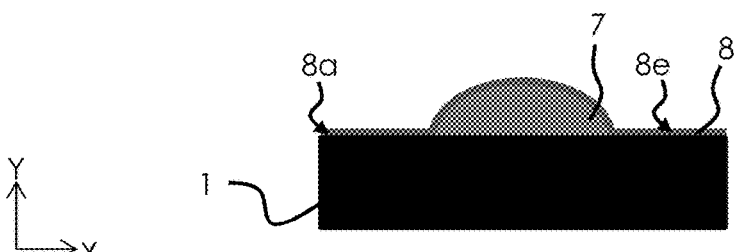
Figure 13:
Figure 14:
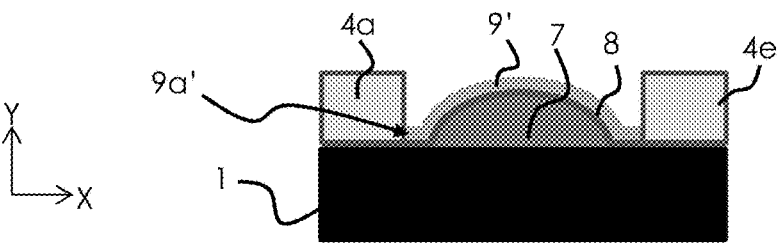
Figure 15:
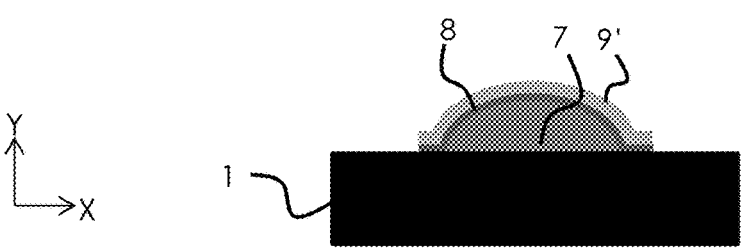

Finally, still in reference to FIG. 10, the continuous bond coat 8 is etched in the zones wherein it is not covered by the electrical structure 9, i.e. in the zones covered beforehand by the layers of resin 4a, 4e. This etching is carried out by any method of suitable etching, in particular by wet or dry etching.

An integrated circuit such as shown in FIG. 10 is as such obtained, and comprising a level of interconnection formed by the electrical structure 9.

A second embodiment of the invention is described in reference to FIGS. 11 to 15. The references used to describe elements with an identical or similar structure, equivalent or similar to those of the elements of FIGS. 6 to 10 are the same, in order to simplify the description. Moreover, all of the description of the embodiment of FIGS. 6 to 10 is not included, as this description applies to the elements of FIGS. 11 to 15 when there are no incompatibilities. Only the notable, structural and functional differences are described.

In reference to FIGS. 11 to 15, the insulating body 7 has a section in the shape of a half-ellipse and comprises a first angled wall rising on the left 7f and a second angled wall decreasing on the right 7g. The walls 7f, 7g are angled with respect to the vertical direction Y in such a way as to each comprise a horizontal component Cx and a vertical component Cy. The angled walls 7f, 7g each have a rising slope extending from the horizontal surface of the substrate 1 to a high point O of said insulating body 7. The angled walls 7f, 7g are curved in such a way as to form 3D interconnections and inductive passive components such as inductances such as shall be presented in what follows. The angled walls 7f, 7g advantageously form a half-ellipse.

Similar to flat angled walls, the curved angled walls 7f, 7g facilitate the depositing of the bond coat 8 as well as of the electrical structure 9'.

Figure 16:
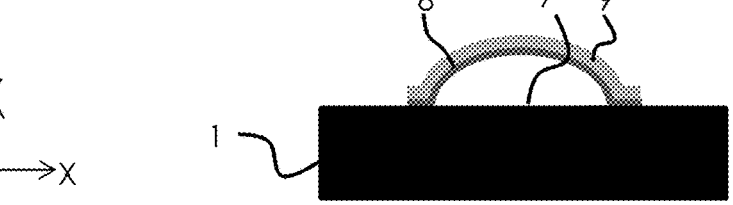

Advantageously, the electrical structure 9 has the shape of a spire. To this effect, as shown in FIG. 16, the insulating body 7 located between the substrate 1 and the bond coat 8 can be removed by wet or dry etching in order to further improve the electrical performance at high frequencies of said spire.

Figure 26:
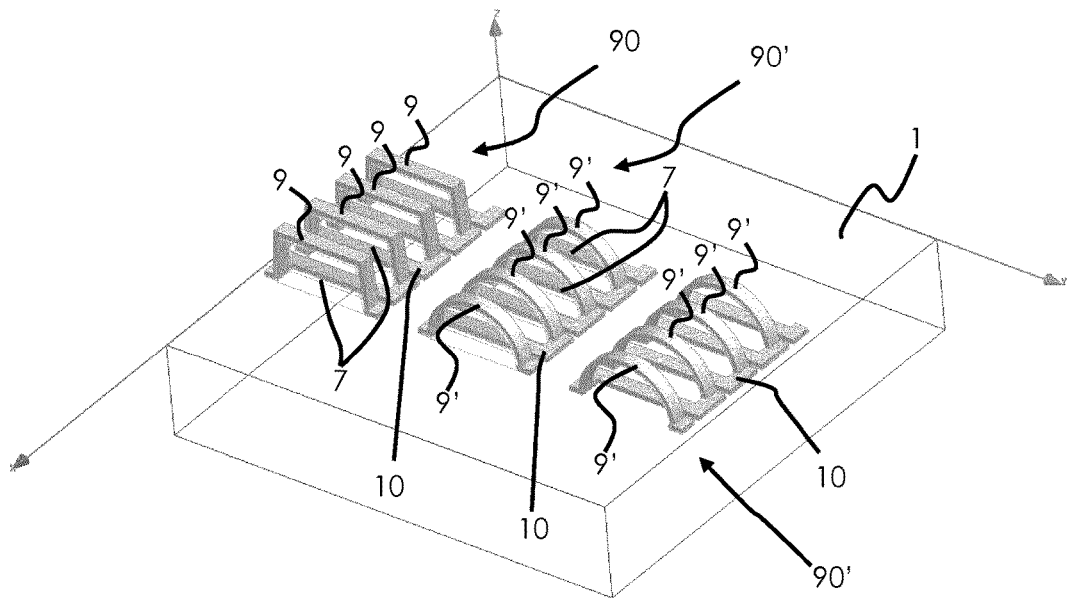
FIG. 26 is a diagrammatical representation of a plurality of inductances according to the invention.
Figure 27:
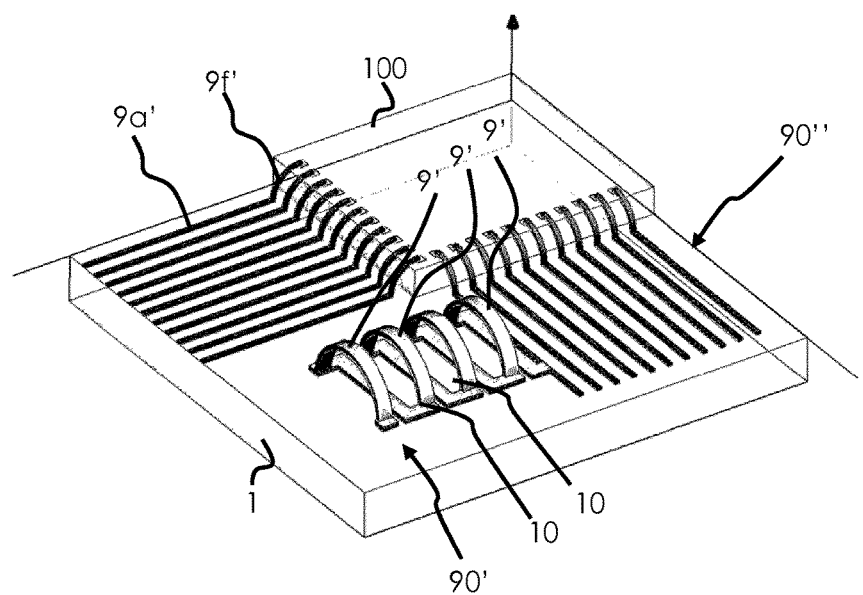
FIG. 27 is a diagrammatical representation of a plurality of inductances according to the invention as well as interconnections according to the invention.

Preferably, in reference to FIG. 26, several curved 9' or trapezoidal 9 electrical structures are connected together by the method according to the invention in order to form one-piece inductances (inductive component) 90, 90'. In practice, flat or curved interconnections 10 are carried out between the elementary spires as shown in FIG. 27. The simultaneous carrying out of the interconnections 10 and of the curved 9' or trapezoidal 9 electrical structures, using a small number of technological steps, makes it possible to reduce the costs and the time for manufacturing inductive components.

Preferably, the insulating body 7 located between the substrate 1 and the bond coat 8 is removed in order to improve the performance of the inductances and of the inductive components at high frequencies, since this body has dielectric losses that are more substantial than those of air 90, 90'.

The method according to the invention makes it possible to obtain, with a reduced number of technological steps, inductive passive components of high quality. Furthermore, it makes it possible to form electrical interconnections 90" comprising an angled wall 9f' that connects various active components to a substrate 1 as shown in FIG. 27. Such a method is particularly advantageous in order to carry out an interconnection with a vertical height greater than 10 μm.

A third embodiment of the invention is described in reference to FIGS. 17 to 22. The references used to describe the elements of identical structure or function, equivalent or similar to those of the elements of FIGS. 6 to 10 are the same, in order to simplify the description. Moreover, all of the description of the embodiment of FIGS. 6 to 10 is not included, as this description applies to the elements of FIGS. 17 to 22 when there are no incompatibilities. Only the notable, structural and functional differences are described.

In the two preceding embodiments, the insulating body 7 was comprised of insulating material. In this third embodiment, the insulating body 7 comprises a body comprised of conductor and/or semi-conductor and/or magnetic and/or dielectric material 70 which is covered by an insulating layer 71 also called passivation or repassivation layer. The body comprised of conductor and/or semi-conductor and/or magnetic and/or dielectric material 70 comprises at least one first wall 70b extending from the horizontal surface of the substrate 1 to a high point of said body 70.

Figure 17:
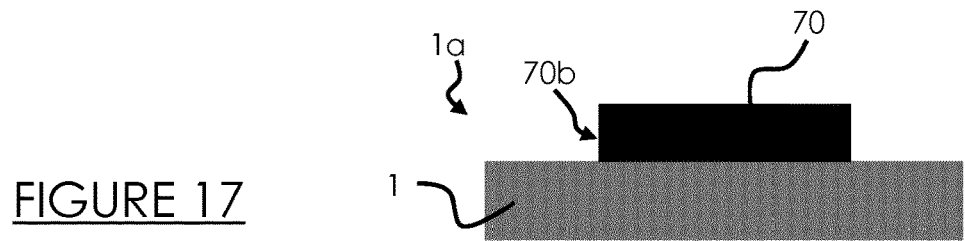
FIGS. 17 to 22 are cross-section diagrammatical views showing the successive steps of a method for manufacturing an integrated circuit according to a third embodiment.
Figure 18:
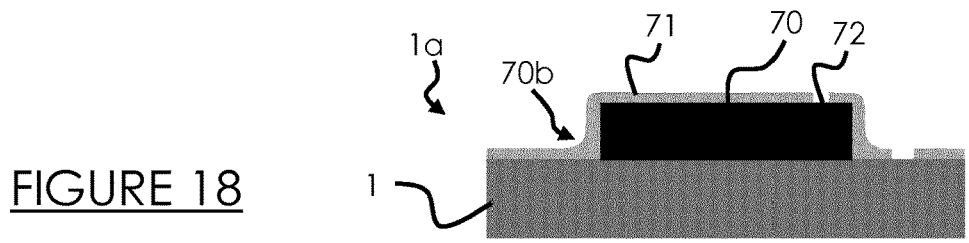
Figure 19:
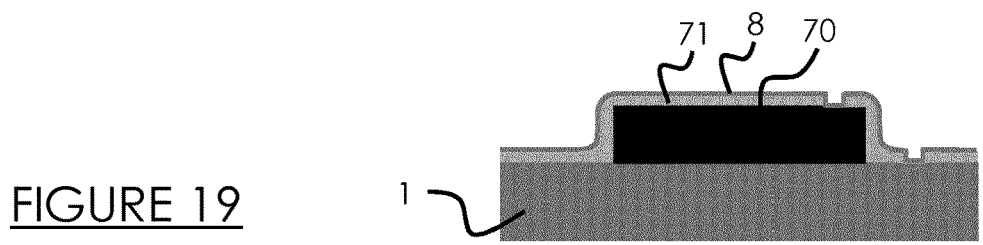
Figure 20:
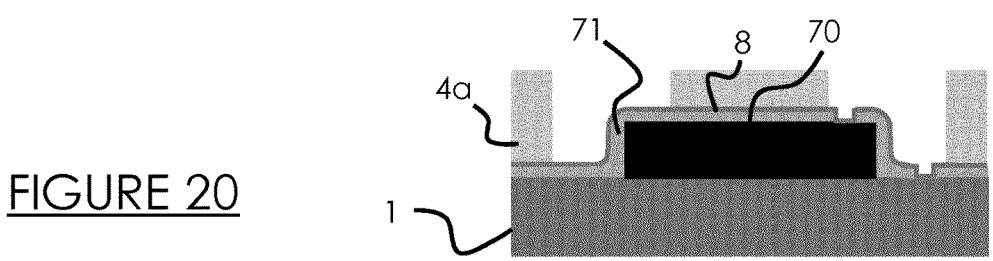
Figure 21:
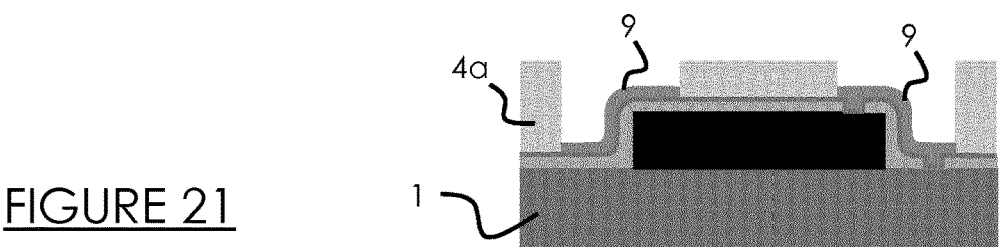
Figure 22:
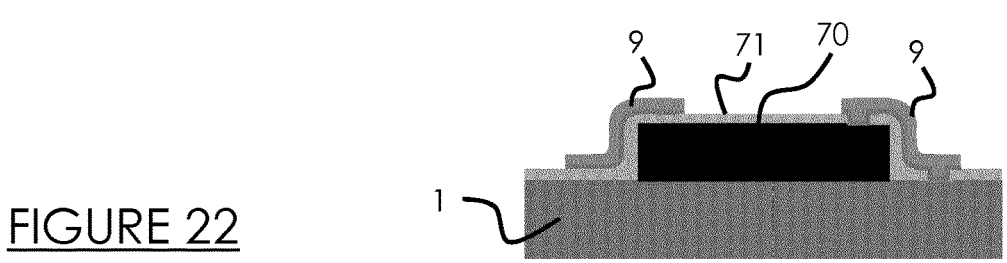

As shown in FIGS. 17 to 19, the body comprised of conductor and/or semi-conductor and/or magnetic and/or dielectric material 70 is covered by an insulating layer 71. The insulating layer 71 is more preferably made from dielectric material. The insulating layer 71 can be comprised of an organic or inorganic material, such as a semi-conductor oxide, a metal oxide, a polymer or any other electrically insulating materials. It can be deposited by spin coating, by pulverisation, by spray, by lamination, by pressing, by growth, by printing (inkjet), by vacuum depositing or by any type of depositing known to those skilled in the art.

Preferably, the insulating layer 71 is deposited by vacuum evaporation, by pulverisation or by spray in order to obtain an insulating layer of thickness that is relatively compliant on all of the walls (not too thin, not too thick).

The insulating layer 71 is deposited onto all of the walls (horizontal, vertical, angled, etc.) of the body 70 as well as on the substrate 1 in such a way as to fully insulate the body 70 comprised of conductor and/or semi-conductor and/or magnetic and/or dielectric material 70. A passivation/insulating of the body 70, in particular of the upper face, makes it possible to separate the interconnections from the connections present on the body 70 as well as from the latter, which reduced the interactions by electromagnetic coupling and consequently, electrical losses. In addition, this makes it possible to route interconnections above the connection pads of the body 70, which makes it possible to increase the routing density and to reduce the number of layers of metallisations required for the interconnection of high-density input-output systems. The cost of manufacturing is then reduced.

In this example, in reference to FIG. 18, openings 72 are made in the insulating layer 71 using a method of photolithography or using a chemical, wet or dry etching, by plasma or by laser in such a way as to structure the insulating layer 71. Preferably, the insulating layer 7 is photosensitive, which makes it possible to avoid the use of a sacrificial layer to create the openings 72, as such rendering the structuring simpler, i.e., the forming of spaces wherein the interconnections 9 can be formed. Still in reference to FIG. 18, these openings 72 provided in the insulating layer 71 make it possible to carry out a contact between the interconnections 9 and said body 70 as well as between the interconnections 9 and the substrate 1. Advantageously, the insulating layer 71 makes it possible to form a controlled inclination slope over the body comprised of conductor and/or semi-conductor and/or magnetic and/or dielectric material of which the first walls 70b are vertical or undercut. In the case where the walls of said body 70 are undercut, the insulating layer 71 fills a function of electrical insulation. The insulating layer 71 assure the physical continuity between the substrate 1 and the walls of said body 70, as such making it possible to carry out a continuous one-piece electrical structure. The insulating layer 71 as such authorises the formation of a one-piece electrical structure on a body comprised of conductor and/or semiconductor and/or magnetic and/or dielectric 70 material.

In order to control the inclination of the slope, the insulating layer 71 is deposited preferably by spray coating.

Figure 29A:
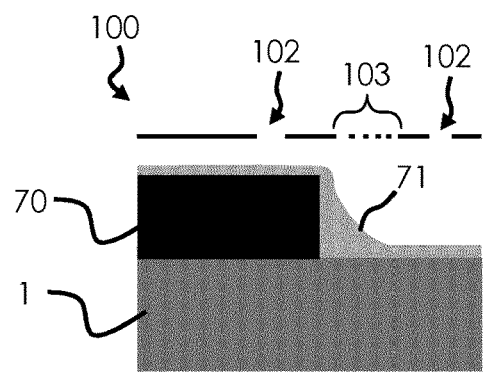
FIGS. 29A and 29B show a step of controlling the inclination of the slope during a step of insulating by means of a mask.

Preferably and according to the needs of the application, the method comprises a step of precise adjustment of the inclination of the slope using a technique of photolithography. In reference to FIGS. 29A and 29B, the insulating layer 7, photosensitive in this case, is insulated through a mask 100 comprising lines and/or patterns 102, 103 of variable lengths and widths so as to modulate the dose of energy received. In other words, the insulating is heterogeneous. The insulating is for example carried out with an ultraviolet light source or a laser. In a practical manner, the insulated portions can be removed, in particular, by means of dissolution in a chemical solution suitable for the material constituting the insulating layer or directly via ablation in the case where a laser of the excimer type is used during the insulating.

In practice, the thickness of the insulating layer 7, which is removed, is proportional to the dose of insulating received. In this embodiment, the mask 100 comprises a zone 101, configured to insulate the slope from the insulating layer 7, which comprises a plurality of patterns 103 of variable lengths and widths in such a way as to control the inclination of said slope precisely. Preferably, the zone 101 comprises a plurality of patterns 103 of which the width is decreasing according to the axis oriented from the top of the slope towards the bottom of the slope as shown in FIG. 29 A. More preferably, the patterns 103 of the mask 100 are positioned parallel to the slope in order to obtain an optimum structuring as well as an optimum inclination. Preferably, the structuring is carried out at the same time as the step of structuring of the openings 72, which accelerates the method of manufacture. In order to form the openings 72, the mask 102 comprises dedicated patterns 102.

Figure 29B:
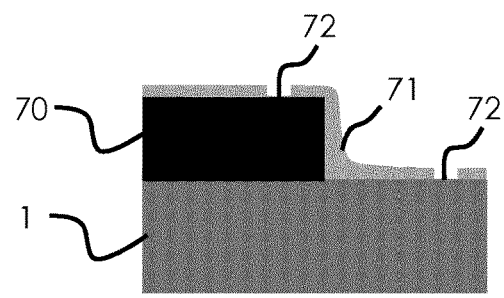

After insulating, as shown in FIG. 29B, the insulating layer 7 comprises a precise inclination slope as well as openings 72 precisely positioned thanks to the mask 100.

This structuring can be carried out using one or several masks 100 and using one or several steps of insulating.

Very advantageously, the inclination of each slope can as such be adjusted individually, which increases the routing possibilities.

In reference to FIGS. 19 to 22, the one-piece electrical structures 9 are deposited similarly to the preceding embodiments in order to carry out interconnections of various and varied shapes. All of the one-piece electrical structures 9 are deposited simultaneously.

Figure 23:
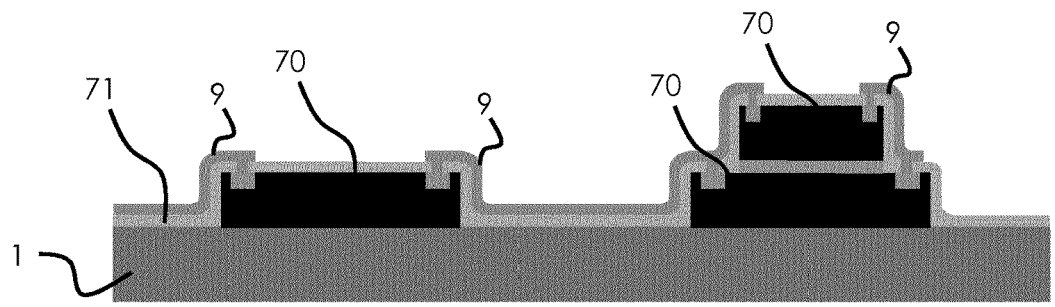
FIGS. 23 to 25 are diagrammatical views of integrated circuit according to the invention.
Figure 24:
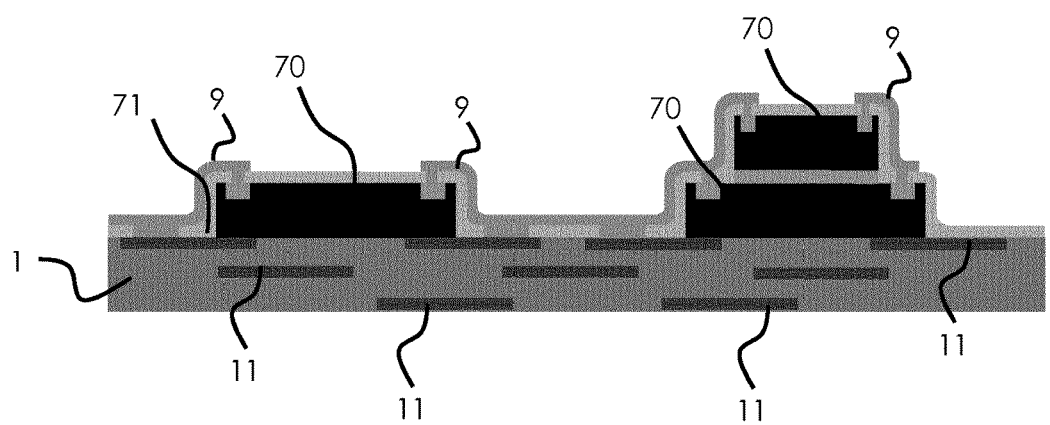
Figure 25:
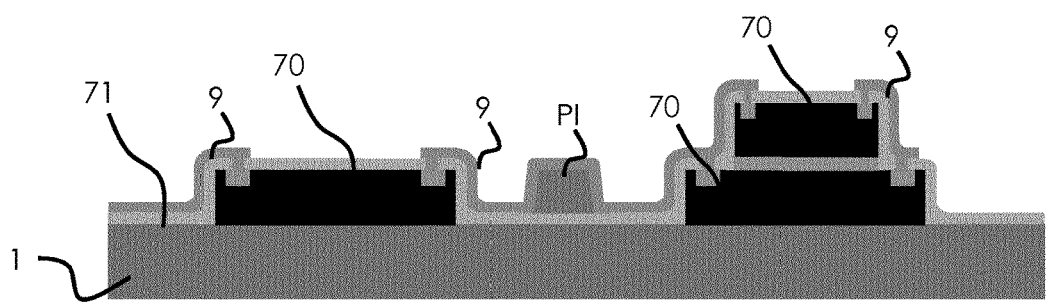
Figure 28:
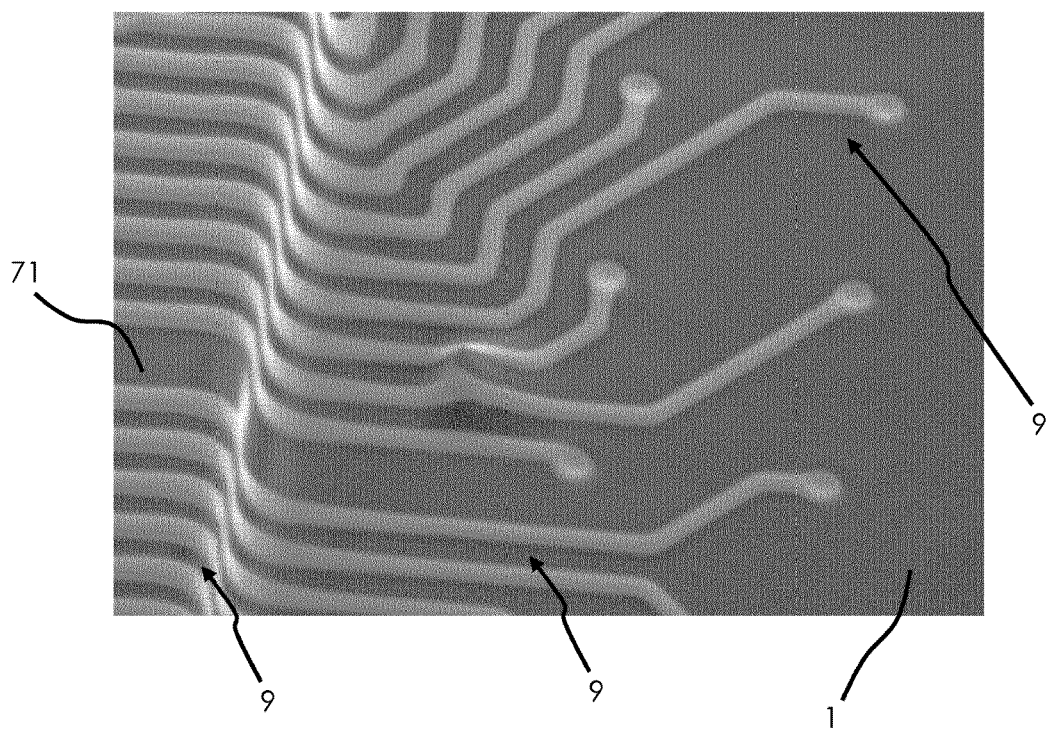
FIG. 28 shows a plurality of interconnections according to the invention formed on a substrate comprising a body formed of conductor, semi-conductor and dielectric material, insulated by an insulating layer.

The method according to the invention authorises by default the carrying out of multi-level interconnections 9 onto a substrate comprising a plurality of insulating bodies 7 dispersed and/or stacked vertically on the surface thereof (FIGS. 23 to 25). It makes it possible to obtain, with a reduced number of technological steps, miniaturised and high-performance 3D systems. These systems can be integrated onto a blank substrate 1 (FIG. 23) or comprising metal tracks 11 (FIG. 24). Furthermore, it makes it possible to simultaneously integrate inductive passive components PI of high quality, such as shown in FIG. 25. This integration, called "system-in-package" makes it possible to further improve the performances and the miniaturisation of the system while still reducing the manufacturing cost thereof. Note that, due to its capacity to treat surfaces, the method makes it possible to integrate several systems simultaneously. This type of integration on the scale of a Wafer-Level-Packaging makes it possible to further reduce the costs and time for manufacturing and to increase the production volume. In reference to FIG. 28, a plurality of interconnections 9 is shown according to the invention formed on a substrate 1 comprising a body formed of conductor, semiconductor and dielectric material, insulated by an insulating layer.

Thanks to the method according to the invention, an increase in the manufacturing output is obtained and a substantial reduction in costs. The depositing in a single step of the electrical structure without preparation of the flanks makes it possible to obtain a base of continuous electrolytic growth over several levels in a fast manner and at least cost.

The method according to the invention as such allows for the manufacturing of integrated circuits, comprising active and passive components, forming one-piece conductive structures, in particular 3D interconnections and inductive passive components having very low losses. It makes it possible to, design and carry out RF and micro-wave power amplifiers of small size that have a high-power output and that therefore have a reduced consumption. It can also make it possible to implement an antenna directly on the integrated circuit. This method can also be used advantageously to assemble and interconnect on the "Wafer-Level-Packaging" scale miniaturised systems of the "System-in-Package" type. The use of the method is not limited to semiconductor substrates, it can be applied to other types of substrates such as glasses, alumina, polymers, PCB, etc. as well as on the flexible substrates (PET, Polyimide, etc.).

The invention claimed is:

1. A method for integrating at least one interconnection for the manufacture of an integrated circuit comprising:
    a step of depositing at least one insulating body onto a substrate comprising a horizontal surface, said insulating body comprising a first wall extending from the horizontal surface of the substrate to a high point of said insulating body;
        wherein the insulating body comprises:
            at least one of a conductor material, a semi-conductor material, a magnetic material, and a dielectric material,
            at least one of a vertical wall covered with an insulating layer and an undercut covered with an insulating layer,
            wherein the at least one of the vertical wall and the undercut enables inclination of the first wall of the insulating body,
            wherein the insulating layer is photosensitive;
    a step of making openings in the insulating layer;
    a step of insulating the insulating layer using a mask to precisely control the inclination of the first wall of the insulating body; and
    a step of depositing an electrical structure comprising an electrically conductive material on the horizontal surface of the substrate and the first wall of the insulating body to form an interconnection with the insulating body via the openings,
        wherein the first wall is vertically angled and has a rising slope from the horizontal surface of the substrate to the high point of said insulating body,
        wherein the first wall comprises a horizontal component and a vertical component greater than 10 µm, and
        wherein the ratio of inclination of the horizontal component over the vertical component is between 0.001 and 1.35.

2. The method according to claim 1, wherein the ratio of inclination of the horizontal component over the vertical component is between 0.01 and 1.

3. The method according to claim 1, wherein the mask comprises a zone, configured to insulate the first wall from the insulating body, which comprises a plurality of patterns of variable lengths and widths in such a way as to control the inclination thereof.

4. The method according to claim 3, wherein said zone comprises a plurality of patterns of which the width is decreasing along an axis directed from the top of the first wall of the insulating body downwards.

5. The method according to claim 3, wherein the patterns are positioned parallel to the slope of the first wall of the insulating body in such a way as to create a determined insulation at a predetermined slope height.

6. The method according to claim 1, wherein the mask comprises a plurality of different zones in such a way as to individually control the inclination of several first walls.

7. The method according to claim 1, wherein the openings in the insulating layer are carried out during the step of insulating.

8. The method according to claim 1, comprising a step of depositing a layer of resin-onto the insulating layer in such a way as to form a mould that limits the extension of the electrically conductive material during the step of depositing the electrical structure.

9. The method according to claim 8, wherein said mould has a thickness between 10 and 150 µm and has a width/thickness resolution between 1 for 0.5 and 1 for 50, preferably, between 1 for 2 and 1 for 25.

10. The method according to claim 8, wherein, the substrate comprising a cavity wherein is positioned the insulating body, said mould extends at least partially into said cavity adjacently to said insulating body.

11. The method according to claim 1, wherein the horizontal component is between 0.1 and 150 µm, preferably, between 1 and 75 µm.

12. The method according to claim 1, comprising a step of depositing a bond coat onto said substrate and said insulating body prior to the step of depositing the electrical structure.

13. An integrated circuit comprising a substrate comprising:
  a substrate comprising a horizontal surface;
  at least one insulating body located on said substrate comprising:
    a first wall extending from the horizontal surface of the substrate to a high point of the insulating body, and
    at least one of a vertical wall and an undercut,
      wherein the at least one of the vertical wall and the undercut is covered with a photosensitive insulating layer through a mask to precisely control the inclination of the first wall of the insulating body; and
  an electrical structure comprising an electrically conductive material on the horizontal surface of the substrate and the first wall of the insulating body,
    wherein the first wall is vertically angled and has a rising slope from the horizontal surface of the substrate to the high point of said insulating body, with the first wall comprising a horizontal component and a vertical component greater than 10 µm, the ratio of inclination of the horizontal component over the vertical component is between 0.001 and 1.35.

* * * * *